(12) United States Patent
Menzel et al.

(10) Patent No.: US 8,853,915 B2
(45) Date of Patent: Oct. 7, 2014

(54) BONDING ON SILICON SUBSTRATE HAVING A GROOVE

(75) Inventors: Christoph Menzel, New London, NH (US); Gregory DeBrabander, San Jose, CA (US); Corina Nistorica, San Jose, CA (US)

(73) Assignee: FUJIFILM Dimatix, Inc., Lebanon, NH (US)

( * ) Notice: Subject to any disclaimer, the term of this patent is extended or adjusted under 35 U.S.C. 154(b) by 247 days.

(21) Appl. No.: 12/562,618

(22) Filed: Sep. 18, 2009

(65) Prior Publication Data

US 2010/0066206 A1   Mar. 18, 2010

Related U.S. Application Data

(60) Provisional application No. 61/098,187, filed on Sep. 18, 2008.

(51) Int. Cl.
| | | |
|---|---|---|
| *H01L 41/053* | (2006.01) | |
| *H01L 41/22* | (2006.01) | |
| *B41J 2/045* | (2006.01) | |
| *H01L 41/313* | (2013.01) | |
| *H01L 41/09* | (2006.01) | |

(52) U.S. Cl.
CPC .......... *H01L 41/0973* (2013.01); *H01L 41/313* (2013.01)
USPC .............. 310/324; 310/348; 347/48; 347/68; 347/70; 347/71

(58) Field of Classification Search
USPC ................. 310/324, 348; 347/48, 68, 70, 71
See application file for complete search history.

(56) References Cited

U.S. PATENT DOCUMENTS

| | | | | |
|---|---|---|---|---|
| 5,185,550 | A | * | 2/1993 | Morita et al. ................. 310/344 |
| 6,688,718 | B1 | * | 2/2004 | Steinfield et al. ............... 347/18 |
| 6,794,958 | B2 | * | 9/2004 | Philliber et al. .............. 333/189 |
| 7,048,361 | B2 | | 5/2006 | Schmachtenberg et al. |
| 7,211,935 | B1 | * | 5/2007 | Houk ............................ 310/348 |
| 2001/0013641 | A1 | * | 8/2001 | Onodera et al. .............. 257/667 |
| 2004/0263582 | A1 | | 12/2004 | Sugahara |

(Continued)

FOREIGN PATENT DOCUMENTS

| | | |
|---|---|---|
| EP | 1520701 B1 | 4/2005 |
| JP | 55-109668 | 8/1980 |

(Continued)

OTHER PUBLICATIONS

International Search Report and Written Opinion mailed Apr. 14, 2010 in co-pending international application No. PCT/US2009/057433.

(Continued)

*Primary Examiner* — Thomas Dougherty
(74) *Attorney, Agent, or Firm* — Fish & Richardson P.C.

(57) ABSTRACT

A method and apparatus for bonding on a silicon substrate are disclosed. An apparatus includes a membrane having a membrane surface, a groove in the membrane surface, a transducer having a transducer surface substantially parallel to the membrane surface, and an adhesive connecting the membrane surface to the transducer surface. The groove can be configured to permit flow of adhesive into and through the groove while minimizing voids or air gaps that could result from incomplete filling of the groove. Multiple grooves can be formed in the membrane surface and can be of uniform depth.

28 Claims, 17 Drawing Sheets

(56) References Cited

U.S. PATENT DOCUMENTS

| | | |
|---|---|---|
| 2005/0099467 A1 | 5/2005 | Bibl et al. |
| 2005/0247990 A1* | 11/2005 | Cheng .......................... 257/432 |
| 2005/0259135 A1* | 11/2005 | Mita et al. ...................... 347/70 |
| 2006/0066689 A1 | 3/2006 | Hori |
| 2006/0176340 A1 | 8/2006 | Murata |
| 2007/0035579 A1* | 2/2007 | Bibl et al. ...................... 347/40 |
| 2007/0046108 A1 | 3/2007 | Pearson et al. |
| 2007/0120896 A1* | 5/2007 | Stephens et al. ............... 347/68 |
| 2007/0263038 A1 | 11/2007 | Bibl |
| 2010/0066206 A1 | 3/2010 | Menzel et al. |
| 2011/0250403 A1 | 10/2011 | Higginson et al. |

FOREIGN PATENT DOCUMENTS

| | | | |
|---|---|---|---|
| JP | 03-070306 | * | 3/1991 |
| JP | 04-031054 | | 2/1992 |
| JP | 05-330069 | | 12/1993 |
| JP | 2002-210965 A | | 7/2002 |
| JP | 2003-157565 A | * | 5/2003 |
| JP | 2005-138586 | | 2/2005 |
| JP | 2005-104038 | | 4/2005 |
| JP | 2006-076128 | | 3/2006 |
| JP | 2006-211058 | * | 8/2006 |
| JP | 2008-517780 | | 5/2008 |
| WO | WO2007008986 A1 | | 1/2007 |
| WO | 2010/033774 | | 3/2010 |
| WO | WO 2010/033774 | | 3/2010 |

OTHER PUBLICATIONS

International Search Report and Written Opinion dated Oct. 6, 2009 issued in International Application No. PCT/US2009/54165.
International Preliminary Report on Patentability dated Mar. 31, 2011 issued in International Application No. PCT/US2009/54165.
European Search Report; May 2, 2013; European Patent Office (EPO); EP 09815247.3; 3 pages.
Chinese Office Action in Chinese Application No. 200980137309.2, dated Aug. 28, 2012, 9 pages.
Japanese Office Action, with English Translation, JP Application No. 2011-527984, mailed Oct. 29, 2013, 6 pages.
Chinese Office Action, with English translation, CN Application No. 200980137309.2, mailed Dec. 3, 2013, 14 pages.
European Office Action in European Application No. 09815247.3, dated Jun. 11, 2013, 4 pages.

* cited by examiner

BONDING ON SILICON SUBSTRATE HAVING A GROOVE

This application claims the benefit of U.S. Provisional Application No. 61/098,187, filed Sep. 18, 2008, and incorporated herein by reference.

BACKGROUND

The following disclosure relates to bonding on a substrate, such as a silicon die. In some implementations of a fluid ejection device, fluid droplets are ejected from one or more nozzles onto a medium. The nozzles are fluidically connected to a fluid path that includes a fluid pumping chamber. The fluid pumping chamber is actuated by a transducer, and when actuated, the fluid pumping chamber causes ejection of a fluid droplet. The medium can be moved relative to the fluid ejection device. The ejection of a fluid droplet from a particular nozzle is timed with the movement of the medium to place a fluid droplet at a desired location on the medium. In these fluid ejection devices, it is usually desirable to eject fluid droplets of uniform size and speed and in the same direction in order to provide uniform deposition of fluid droplets on the medium.

SUMMARY

This disclosure relates to bonding on a membrane, such as bonding a transducer to a substrate, such as a silicon die. In one aspect, the systems, apparatus, and methods described herein include a membrane having a membrane surface and a groove formed in the membrane surface. A transducer can have a transducer surface arranged substantially parallel with the membrane surface. An adhesive can connect the membrane surface to the transducer surface, and the adhesive can at least partially fill the groove.

In another aspect, the systems, apparatus, and methods described herein include arranging a transducer surface of a transducer substantially parallel with a membrane surface of a membrane. The transducer surface can face the membrane surface and the membrane surface can include a groove. An adhesive can be applied to the transducer surface or the membrane surface or both. The transducer surface can be pressed against the membrane surface. At least some of the adhesive can be allowed to flow in the groove and substantially fill the groove.

Implementations can include one or more of the following features. The transducer can include a piezoelectric material, such as lead zirconium titanate. The groove can have a width between about 20 microns and about 60 microns. The membrane surface can include multiple grooves formed therein. A pitch of the grooves can be between about 50 microns and about 70 microns. A spacing between grooves can be between about 15 microns and about 25 microns. Depths of multiple grooves can be substantially equal to one another. A depth of a groove can be between about 0.1 microns and about 2.0 microns. The adhesive can include benzocyclobutene, and a groove can be substantially filled with adhesive.

In some embodiments, one or more of the flowing advantages may be provided. Flow of adhesive in or into a groove can reduce the thickness of adhesive between the transducer and the membrane. Reducing the thickness of adhesive can reduce the energy required to actuate a transducer to change the volume of a fluid pumping chamber so as to cause fluid droplet ejection. As a further advantage of a groove, providing space for adhesive to flow can mitigate or prevent a build-up of adhesive, which could press the membrane into the pumping chamber and thereby alter the effectiveness of the transducer when actuated. Because such build-up can be non-uniform across multiple actuators and fluid pumping chambers, the groove can improve uniformity of fluid droplet ejection size and speed, as well as the accuracy of placement of fluid droplets on a medium.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

An apparatus for fluid droplet ejection can have a fluid ejection module, e.g., a rectangular plate-shaped printhead module, which can be a die fabricated using semiconductor processing techniques. The fluid ejector can also include a housing to support the printhead module, along with other components such as a flex circuit to receive data from an external processor and provide drive signals to the printhead module.

The printhead module includes a substrate in which a plurality of fluid flow paths are formed. The printhead module also includes a plurality of actuators, e.g., transducers, to cause fluid to be selectively ejected from the flow paths. Thus, each flow path with its associated actuator provides an individually controllable MEMS fluid ejector unit.

The substrate can include a flow-path body, a nozzle layer, and a membrane layer. The flow-path body, nozzle layer, and membrane layer can each be silicon, e.g., single crystal silicon. The fluid flow path can include a fluid inlet, an ascender, a pumping chamber adjacent the membrane layer, and a descender that terminates in a nozzle formed through the nozzle layer. Activation of the actuator causes the membrane to deflect into the pumping chamber, forcing fluid out of the nozzle.

The membrane can have recesses formed therein. An adhesive can bond or connect a transducer to the membrane, and the adhesive can at least partially occupy the recesses. The recesses can be arranged to define protrusions, such as posts, on the membrane. Alternatively, the recesses can be formed as grooves in the membrane.

Figure 1:
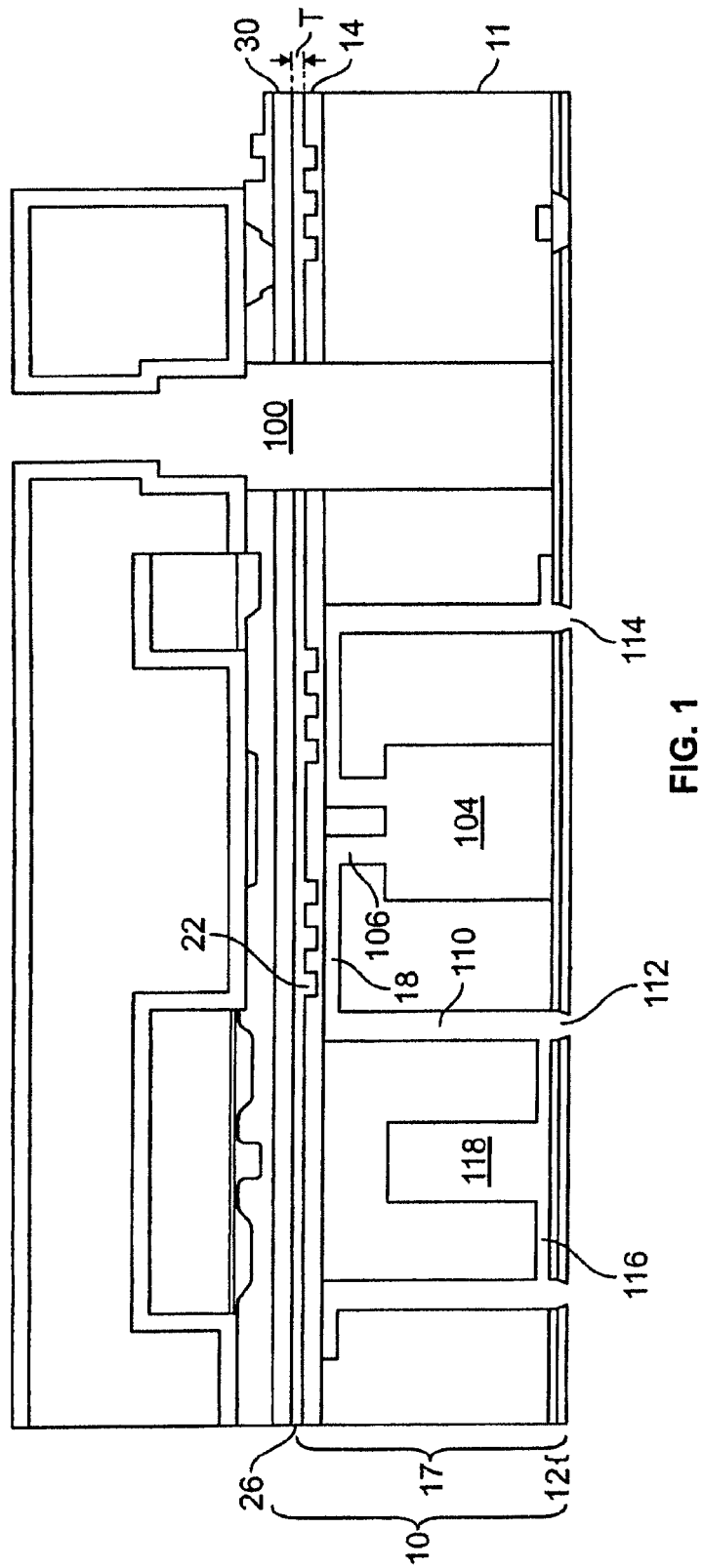
FIG. 1 is a cross-sectional view of an apparatus for fluid droplet ejection.

FIG. 1 is a cross-sectional view of a portion of a fluid droplet ejection apparatus. An inlet 100 fluidically connects a fluid supply (not shown) to a die 10 that includes a substrate 17 and a transducer 30. The substrate 17 includes a flow-path body 11. The inlet 100 is fluidically connected to an inlet passage 104 formed in the flow-path body 11 through a passage (not shown). The inlet passage 104 is fluidically connected to a pumping chamber 18, such as through an ascender 106. The pumping chamber 18 is fluidically connected to a descender 110, at the end of which is a nozzle 112. The nozzle 112 can be defined by a nozzle plate 12 that is attached to the die 10. The nozzle 112 includes an outlet 114 defined by an outer surface of the nozzle plate 12. In some implementations, a recirculation passage 116 can be provided to fluidically connect the descender 110 to a recirculation channel 118. A membrane 14 is formed on top of the flow-path body 11 in close proximity to and covering the pumping chamber 18, e.g. a lower surface of the membrane 14 can define an upper boundary of the pumping chamber 18. A transducer 30 is disposed on top of the membrane 14, and a layer of adhesive 26 with a thickness T is between the transducer 30 and the membrane 14 to bond the two to one another. Grooves 22 extend partly, but not entirely, through the membrane 14. Wherever this disclosure refers to more than one groove, it will be understood that a single groove may be present in alternative implementations. In some implementations, each pumping chamber 18 has a corresponding electrically isolated transducer 30 that can be actuated independently. The transducer 30 includes electrodes 84, 88 (see FIG. 10) to allow for actuation of the transducer 30 by a circuit (not shown).

The membrane 14 can be formed of silicon (e.g., single crystalline silicon), some other semiconductor material, oxide, glass, aluminum nitride, silicon carbide, other ceramics or metals, silicon-on-insulator, or any depth-profilable layer. Depth profiling methods can include etching, sand blasting, machining, electrical-discharge machining (EDM), micro-molding, or spin-on of particles. For example, the membrane 14 can be composed of an inert material and have compliance such that actuation of the transducer 30 causes flexure of the membrane 14 sufficient to pressurize fluid in the pumping chamber 18 to eject fluid drops from the nozzle 112. U.S. Patent Publication No. 2005/0099467, published May 12, 2005, the entire contents of which is hereby incorporated by reference, describes examples of a printhead module and fabrication techniques. In some implementations, the membrane 14 can be formed unitary with the flow-path body 11.

In operation, fluid flows through the inlet channel 100 into the flow-path body 11 and through the inlet passage 104. Fluid flows up the ascender 106 and into the pumping chamber 18. When a transducer 30 above a pumping chamber 18 is actuated, the transducer 30 deflects the membrane 14 into the pumping chamber 18. The resulting change in volume of the pumping chamber 18 forces fluid out of the pumping chamber 18 and into the descender 110. Fluid then passes through the nozzle 112 and out of the outlet 114, provided that the transducer 30 has applied sufficient pressure to force a droplet of fluid through the nozzle 112. The droplet of fluid can then be deposited on a medium.

Configuring the membrane 14 with space for flow of the adhesive 26 can prevent build-up of adhesive 26 that might otherwise cause deflection of the membrane 14 into the pumping chamber 18, particularly where adhesive 26 is applied with a non-uniform thickness. The membrane 14 can have a thickness of between about 1.0 micron and about 150 microns, such as between about 8.0 and about 20 microns. The depth D (see FIG. 7) of the grooves 22 can depend on the viscosity of the adhesive 26 during the curing state and the thickness of the adhesive 26 applied to either the membrane 14 or the transducer 30. Temperature can affect the viscosity of the adhesive during the curing cycle, usually making the adhesive 26 more viscous. A highly viscous adhesive 26 may flow slowly and need more space to flow sufficiently quickly before curing. Similarly, the greater the thickness of adhesive 26 between the membrane 14 and the transducer 30, the more space is needed to hold the excess adhesive 26.

Figure 2:
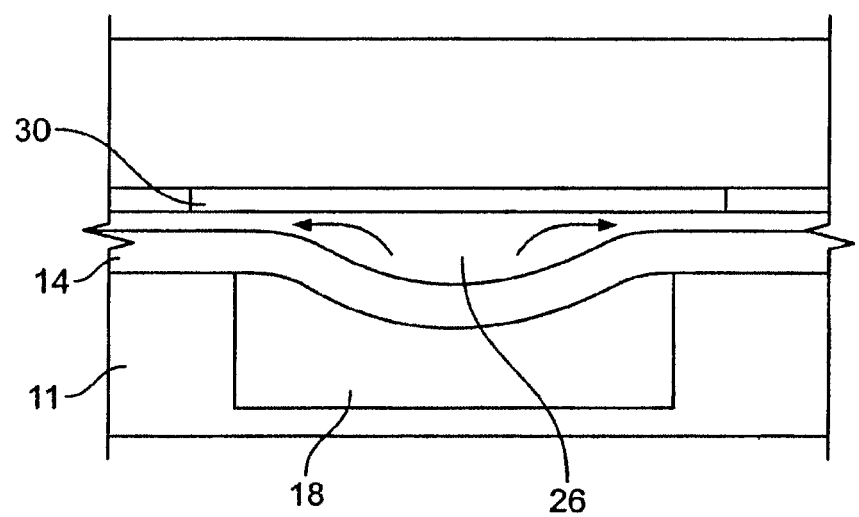
FIG. 2 is a cross-sectional schematic representation of a portion of an apparatus for fluid droplet ejection.

FIG. 2 shows a cross-sectional schematic representation of the pumping chamber 18, a boundary of which is defined by the membrane 14. The membrane 14 shown in FIG. 2 does not include a groove 22. When bonding the transducer 30 to the membrane 14, if the gap between the two near an edge is less than about 0.1 micron, then the adhesive 26 may be trapped, potentially causing a build-up of adhesive and a resultant "bump" in the membrane 14. A bump in the membrane 14 above the pumping chamber 18 can cause deflection of the membrane 14 into the pumping chamber 18, as shown in FIG. 2. In some circumstances, a build-up of adhesive between the transducer 30 and the membrane 14 may reduce the effectiveness of the transducer 30, the pumping chamber 18, or both. In other circumstances, a build-up of adhesive between the transducer 30 and the membrane 14 may increase the stress on the transducer 30 and increase the activity of the transducer 30 within a small region across the die 10. Regardless of whether the effectiveness of the transducer 30 or the pumping chamber 18 are increased or decreased, the effect may be non-uniform across the die 10. This non-uniformity in effectiveness could result in non-uniformity of fluid droplet ejection characteristics, such as fluid droplet size and fluid droplet ejection velocity. Alternatively, the non-uniformity in effectiveness may require increased complexity in controlling the transducers 30 to compensate for the non-uniformity.

To mitigate or prevent the build-up of adhesive 26 above the pumping chambers 18, the membrane 14 can include one or more grooves 22 formed therein. The depth D of the groove 22 in the membrane 14 can be greater than about 0.1 micron, such as greater than about 0.25 micron, to allow the adhesive 26 to flow without getting trapped. When filled with adhesive 26, it can be desirable that the groove 22 has no voids, such as air pockets, between the transducer 30 and the membrane 14 because a void in a groove 22 over the pumping chamber 18 could absorb some of the energy imparted in actuating the transducer 30. This absorption of energy could result in altering, such as reducing, the effectiveness of the transducer 30, the fluid pumping chamber 18, or both. This absorption may be non-uniform across the die 10, which could result in non-uniformity of fluid droplet ejection characteristics, such as fluid droplet size and fluid droplet ejection velocity. Therefore, the groove 22 should be deep enough to allow the adhesive 26 to escape from underneath the transducer 30 but shallow enough to prevent voids between the transducer 30 and the membrane 14. That is, the groove 22 should be configured such then when the transducer 30 and the membrane 14 are brought into contact, the groove 22 is substantially or completely filled with adhesive 26. In some implementations where the thickness T of adhesive 26 applied to the transducer 30 is about 1.0 micron, the depth of the groove 22 should be greater than about 0.1 micron to allow flow of the adhesive 26 but less than about 1.0 micron to minimize or prevent voids in the adhesive 26. The depth of the groove 22 can also depend on the viscosity of the adhesive 26 during the curing state and the thickness of the adhesive 26.

Figure 3:
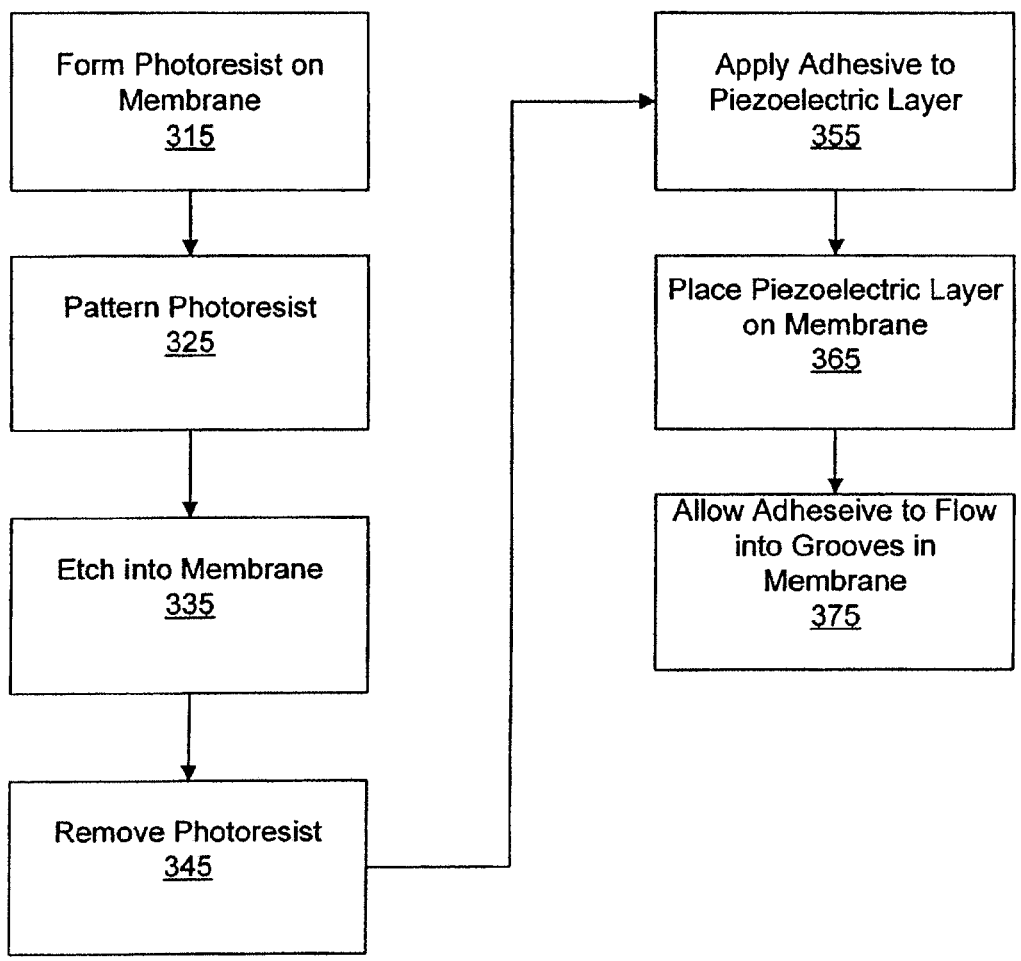
FIG. 3 is a flow diagram of a process for bonding a layer to a membrane.
Figure 4:
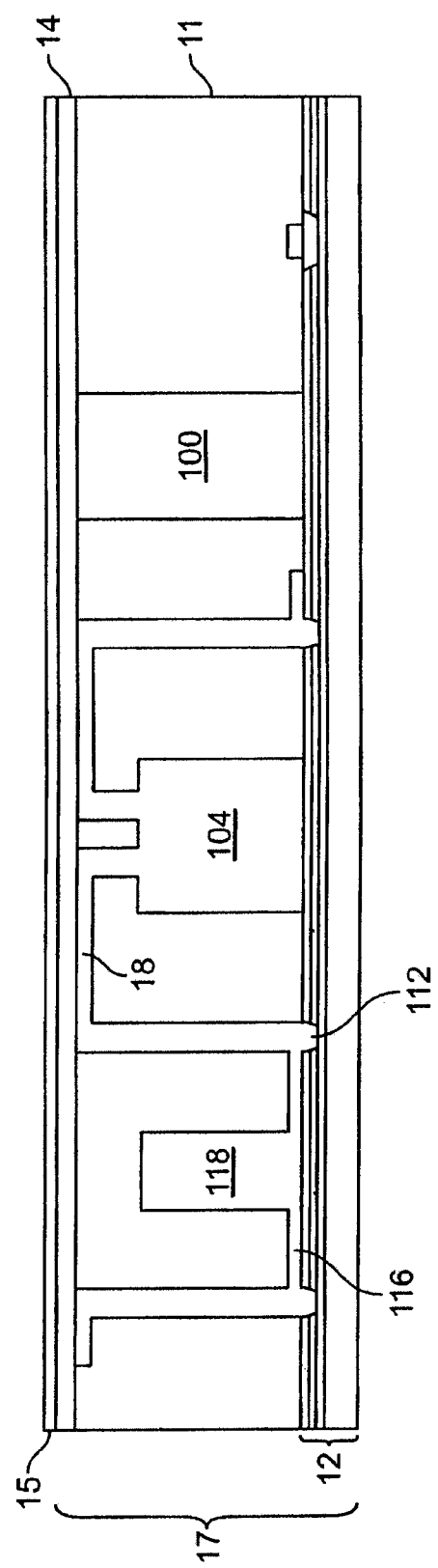
FIGS. 4-8 are cross-sectional schematic representations of stages of forming an apparatus for fluid droplet ejection.
Figure 5:
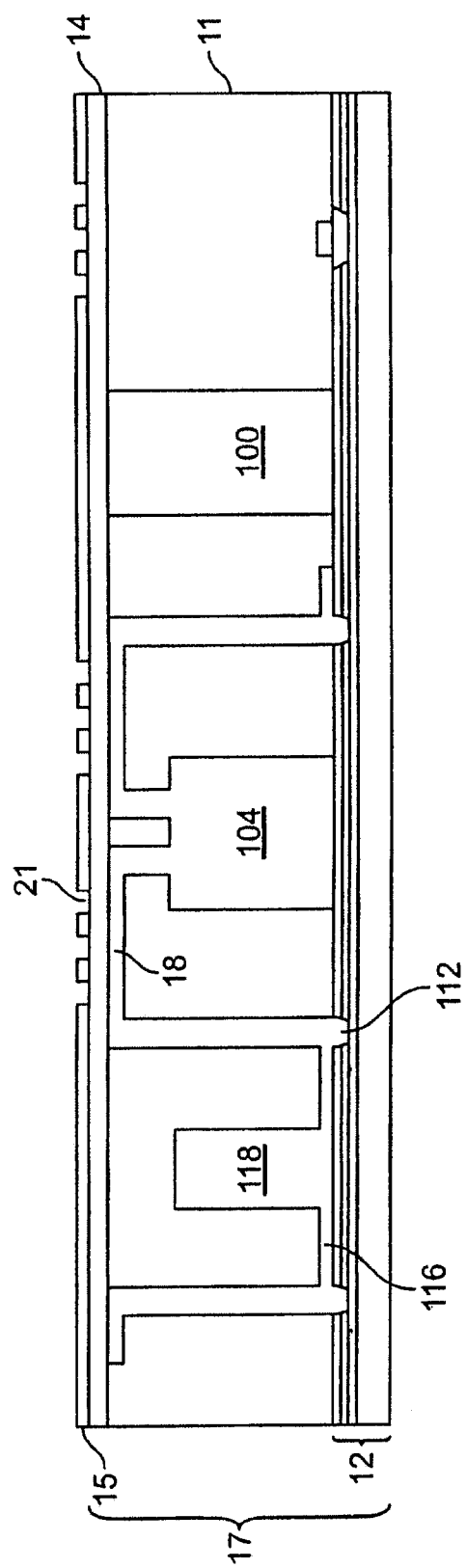
Figure 6:
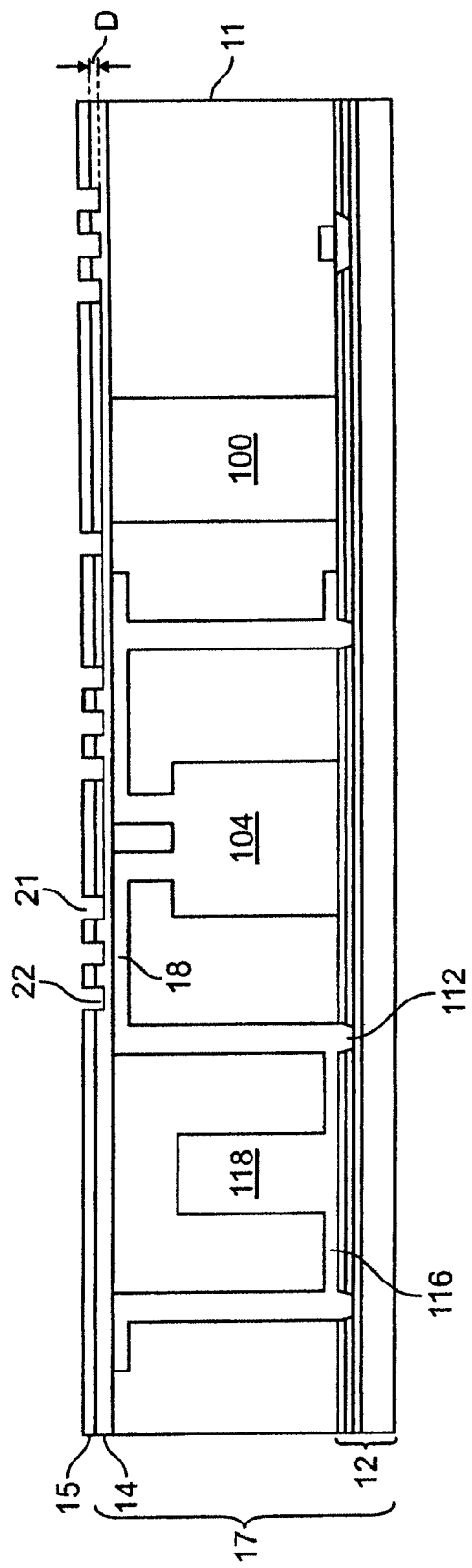
Figure 7:
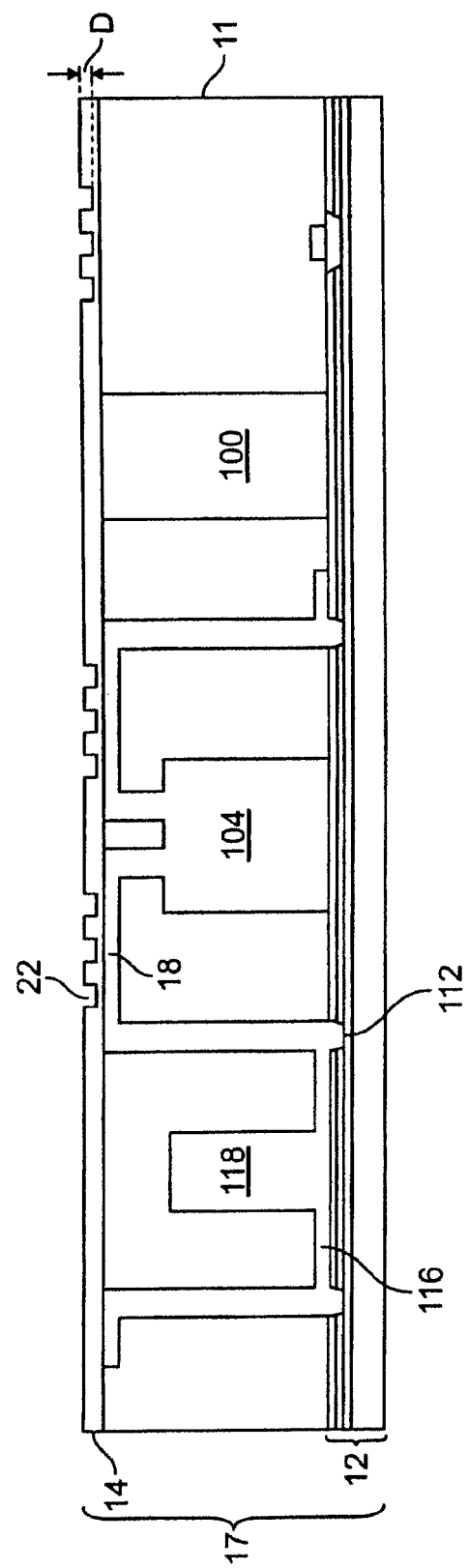

FIG. 3 is a flow chart of a process for bonding the transducer 30 to the membrane 14 of a die 10. FIGS. 4-8 are cross-sectional diagrams of steps in the fabrication of an apparatus for fluid droplet ejection. As shown in FIG. 4, a photoresist layer 15 is formed on top of the membrane 14 (step 315). In some implementations, the nozzle plate 12 has multiple layers, some of which can be used for holding the apparatus during fabrication and can be removed during later fabrication steps. As shown in FIG. 5, the photoresist layer 15 is patterned using conventional photolithography techniques so that portions of the photoresist layer 15 are removed, and apertures 21 are thereby formed in the photoresist layer 15 (step 325). Referring to FIG. 6, the membrane 14 is etched through the apertures 21 in the photoresist layer 15 to form grooves 22 in the membrane 14 (step 335). As shown in FIG. 7, the photoresist layer 15 is then removed (step 345).

In the implementation shown, the grooves 22 do not extend entirely through the membrane 14. A depth D of etching into the membrane 14 can be controlled, for example, by etching for a predetermined amount of time, stopping the etching process when a desired recess depth D of the grooves 22 has been achieved as detected by an in-situ monitoring system, or by including an etch-stop layer in the membrane 14 at depth D. Referring to FIG. 7, adhesive 26 is applied to, or formed on, a surface of the transducer 30 facing the membrane 14 (step 355), and the transducer 30 with adhesive 26 is placed on the membrane 14 (step 365). Alternatively, adhesive 26 is applied to the membrane 14 instead of, or in addition to, adhesive 26 being applied to the transducer 30. Pressure can be applied to press the substrate 17 and the transducer 30 toward each other, and the adhesive 26 can be allowed to at least partially flow into the grooves 22 (step 375). The adhesive can then cure to bond or connect the transducer 30 to the membrane 14.

The membrane 14 can have a thickness of between about 1.0 micron and about 150 microns, such as between about 8.0 microns and about 20 microns. The depth of the groove 22 can depend on the viscosity of the adhesive 26 during the curing state and the thickness of the adhesive 26 applied to either the transducer 30 or the membrane 14. Temperature can affect the viscosity of the adhesive 26 during the curing cycle, usually making the adhesive 26 more viscous. A highly viscous adhesive 26 may flow slowly and need more space to flow sufficiently before curing, and a relatively deep groove 22 may be needed. Similarly, the greater the thickness of adhesive 26 between the membrane 14 and the transducer 30, the more space is needed to hold excess adhesive 26. In some implementations, when a layer of adhesive 26 applied to the transducer 30 has a thickness of about 1.0 micron, the depth D of the groove 22 is about 0.25 microns. In some other implementations, the depth D of the groove 22 can be between about 0.1 micron and about 2.0 microns. In implementations having multiple grooves 22, the grooves 22 can be of about equal depth D. In an alternative implementation, the groove 22 can extend entirely through the membrane 14 so long as remaining membrane material adjacent the recesses is adequately supported, such as by the flow-path body 11.

Figure 8:
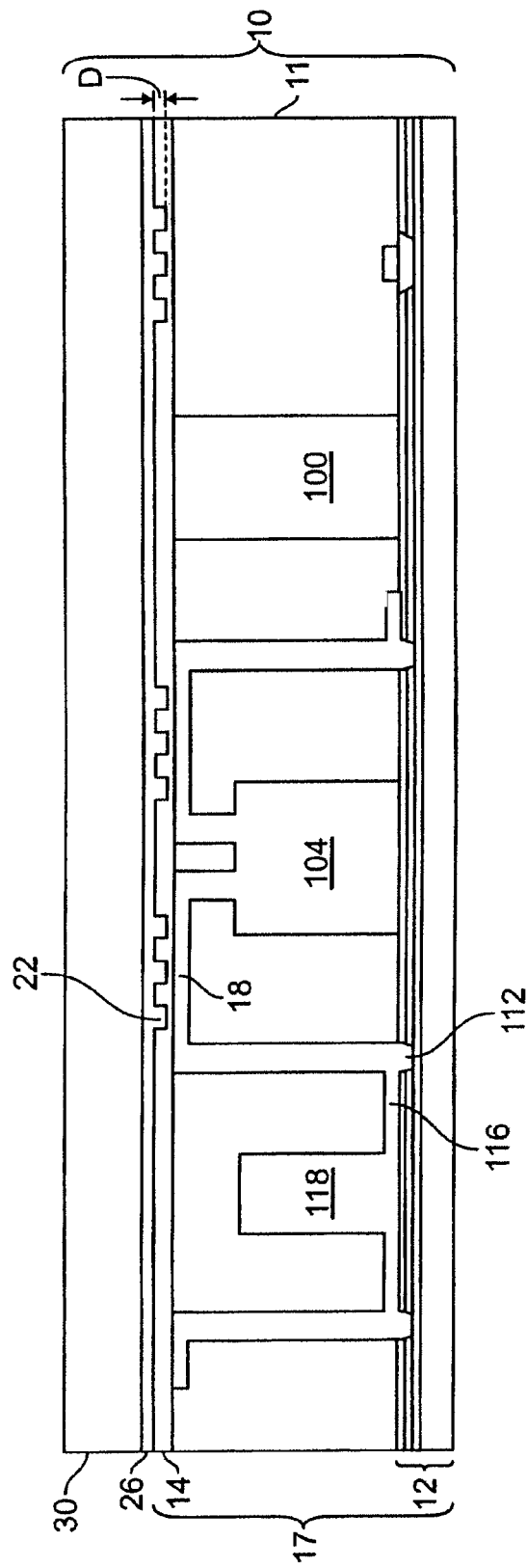

FIG. 8 shows the transducer 30 and adhesive 26 on top of the membrane 14. The adhesive 26 is between the transducer 30 and the membrane 14 and substantially or completely fills the grooves 22. The transducer 30 and the membrane 14 are not in direct contact because a thickness of adhesive 26 is between them. As the thickness of the layer of adhesive 26 increases, more energy (e.g., greater voltage) must be applied to the transducer 30 to cause sufficient deformation of the fluid pumping chamber 18 to effect fluid droplet ejection. Reducing the thickness of the layer of adhesive 26 is therefore desirable to minimize the energy requirements of the transducer 30.

In some implementations, the adhesive 26 must be present in a minimum thickness because of the material properties of the adhesive 26 or other limitations such as the process for applying the adhesive. For example, in the absence of the grooves 22, with some types of adhesives, the minimum thickness of the adhesive 26 can be between about 1000 nanometers and about 1200 nanometers. In contrast, with the use of grooves 22, the minimum achievable thickness of the adhesive 26 can be about 200 nanometers or less, such as about 100 nanometers or less. The grooves 22 can reduce the minimum achievable thickness of adhesive 26 by allowing some adhesive 26 to flow in, into, along, or through the grooves 22 when the transducer 30 and adhesive 26 are brought into contact with, or pressed toward, the membrane 14.

To attempt to achieve a minimum thickness of the adhesive 26, the transducer 30 and the membrane 14 can be pressed together to squeeze out excess adhesive 26. A flow resistance of the adhesive 26 increases linearly with an increase in a distance that the adhesive 26 travels before exiting from between the transducer 30 and the membrane 14. For example, without the grooves 22, adhesive 26 near a center of the transducer 30 and the membrane 14 travels about 75 millimeters before being squeezed out. As a contrasting example, where the membrane 14 has grooves 22 formed therein, adhesive 26 near the center only travels about 150 microns to flow into the grooves 22. Since the flow resistance is proportional to the distance traveled, adhesive 26 flowing into the grooves 22 has a flow resistance that is about 500 times less than without the grooves 22. Thus, more excess adhesive 26 can be squeezed out before curing, which can result in a relatively thinner layer of adhesive 26. For example, if a 1.0 micron layer of adhesive 26 is applied between the two parts, the minimum thickness without grooves 22 might be between about 1000-1200 nanometers. With grooves 22, by contrast, a minimum thickness of adhesive 26 may be about 200 nanometers or less. The flow resistance of the adhesive between the transducer 30 and membrane 14 can be described by the formula $R = k\mu L/t^3$, where R is flow resistance, k is a constant, $\mu$ is a viscosity of the fluid, L is a length, and t is thickness of the adhesive 26.

As noted, the adhesive 26 can be applied to the transducer 30 before bonding. In other implementations, the adhesive 26 is applied to the membrane 14 instead of, or in addition to, adhesive 26 being applied to the transducer 30. The amount of adhesive 26 applied in the grooves 22 can be minimized to maximize the percentage of applied adhesive 26 that flows into the grooves 22. The adhesive 26 can be an organic material, such as benzocyclobutene (BCB), or other suitable material.

Figure 9A:
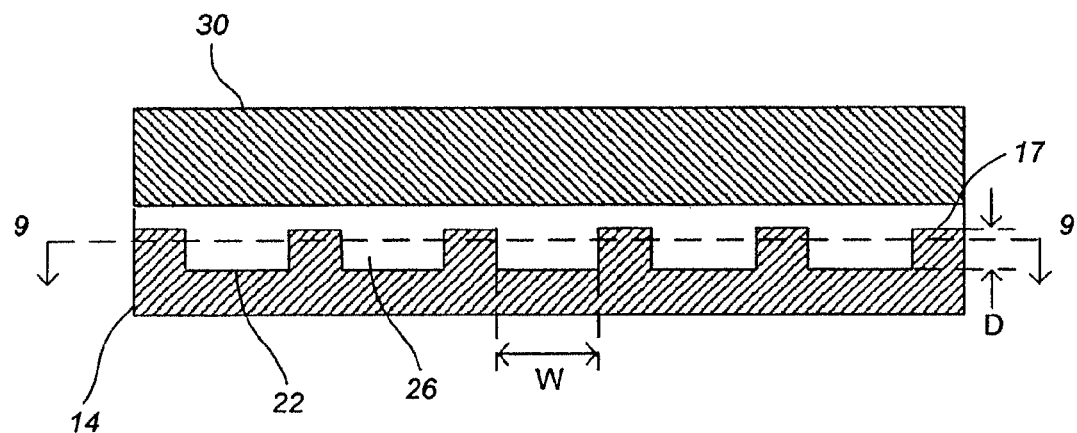
FIG. 9A is a cross-sectional schematic representation of a portion of an apparatus for fluid droplet ejection.
Figure 9B:
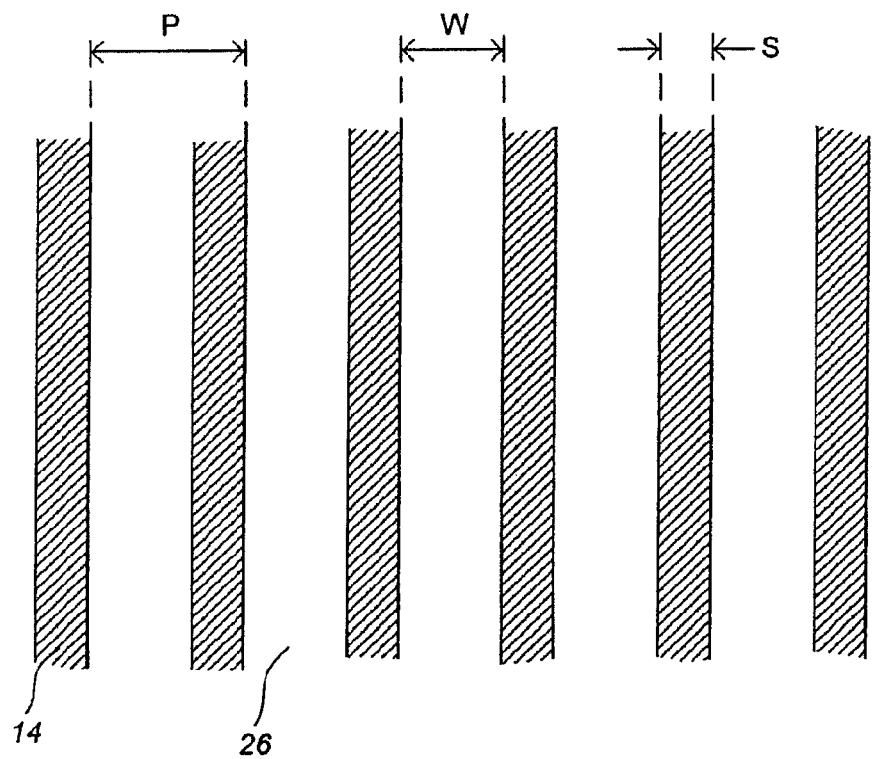
FIG. 9B is a cross-sectional schematic representation along line 9-9 in FIG. 9A.

FIGS. 9A and 9B are schematic representations of a portion of the membrane 14, adhesive 26, and transducer 30. The distance between the membrane 14 and the transducer 30 has been exaggerated for illustrative purposes. The membrane 14 has grooves 22 on all or a portion of a top surface thereof. The transducer 30 is above the membrane 14. The adhesive 26 is between the transducer 30 and the membrane 14. The grooves 22 define spaces into which adhesive 26 can flow. The width W of the groove 22 should be configured large enough to allow adhesive to flow into or through the groove 22. For example, if the width W is too small, then the adhesive 26 may not flow sufficiently before curing to substantially fill the grooves 22. The spacing S can be made narrow enough that at least some of the adhesive 26 can travel to a groove 22 before the adhesive 26 cures. But the spacing S can also be made wide enough to allow sufficient bonding area for the transducer 30. The width W and spacing S of the grooves 22 can also depend on the viscosity of the adhesive 26 and the thickness of the adhesive 26 applied to the membrane 14, the transducer 30, or both. In some implementations, a groove 22 can have a width W between about 20 microns and about 60 microns, such as about 40 microns. In some implementations, multiple grooves 22 are formed with uniform width W. As discussed above, the depth D can be between about 0.10 microns and about 2.0 microns, such as about 0.25 microns. Where the membrane 14 has multiple grooves 22, the pitch P of the grooves 22 can be between about 50 microns and about 70 microns, such as about 59.5 microns, and/or the spacing S between grooves 22 can be between about 15 microns and about 25 microns, such as about 19.5 microns.

Figure 10:
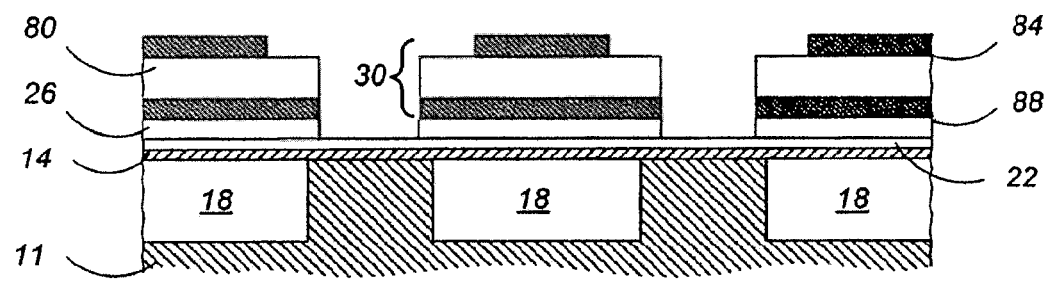
FIG. 10 is a cross-sectional schematic representation of a portion of an apparatus for fluid droplet ejection.

FIG. 10 is a cross-sectional diagram of an implementation of transducers 30 on the membrane 14 above pumping chambers 18. Multiple pumping chambers 18 are shown, and in this implementation, the membrane 14 includes a groove 22 above the pumping chambers 18. The transducer 80 includes a top electrode 84, a piezoelectric layer 80, and a bottom electrode 88. The top electrode 84 and the bottom electrode 88 are arranged on the top and bottom surface, respectively, of the piezoelectric layer 80. The adhesive 26 bonds the transducer 80 to the membrane 14. A circuit (not shown) can be electrically connected to the top electrode 84 and to the bottom electrode 88. The circuit can apply a voltage between the electrodes 84, 88. The applied voltage can actuate the transducer 30, causing the piezoelectric layer 80 to deform. This deformation can deflect the membrane 14 into the pumping chamber 18, thereby forcing fluid out of the pumping chamber 18.

Figure 11:
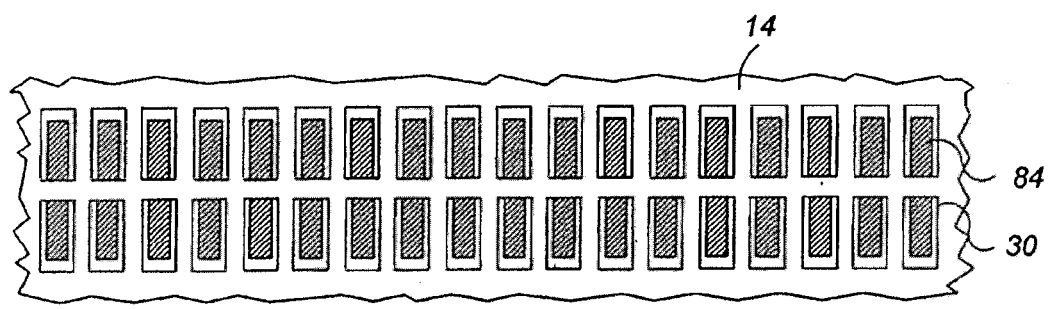
FIG. 11 is a plan view of a portion of the apparatus of FIG. 10.
Figure 12:
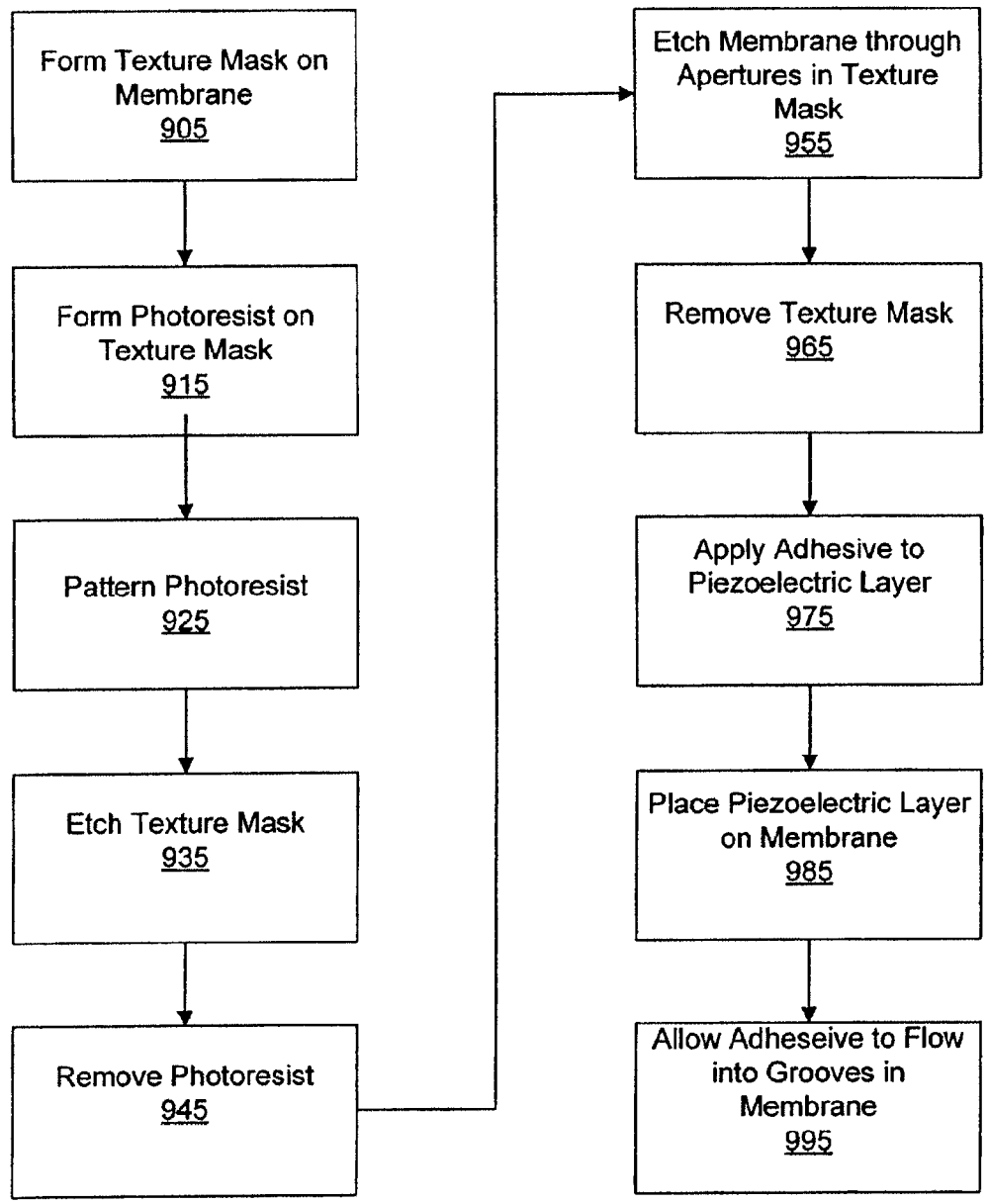
FIG. 12 is a flow diagram of a process of bonding a layer to a membrane.

FIG. 11 is a plan diagram of the implementation shown in FIG. 12, and two rows of transducers 30 are shown. These two rows of transducers 30 correspond to two rows of pumping chambers 18, which can correspond to two rows of nozzles 112 beneath the pumping chamber 18.

Figure 13:
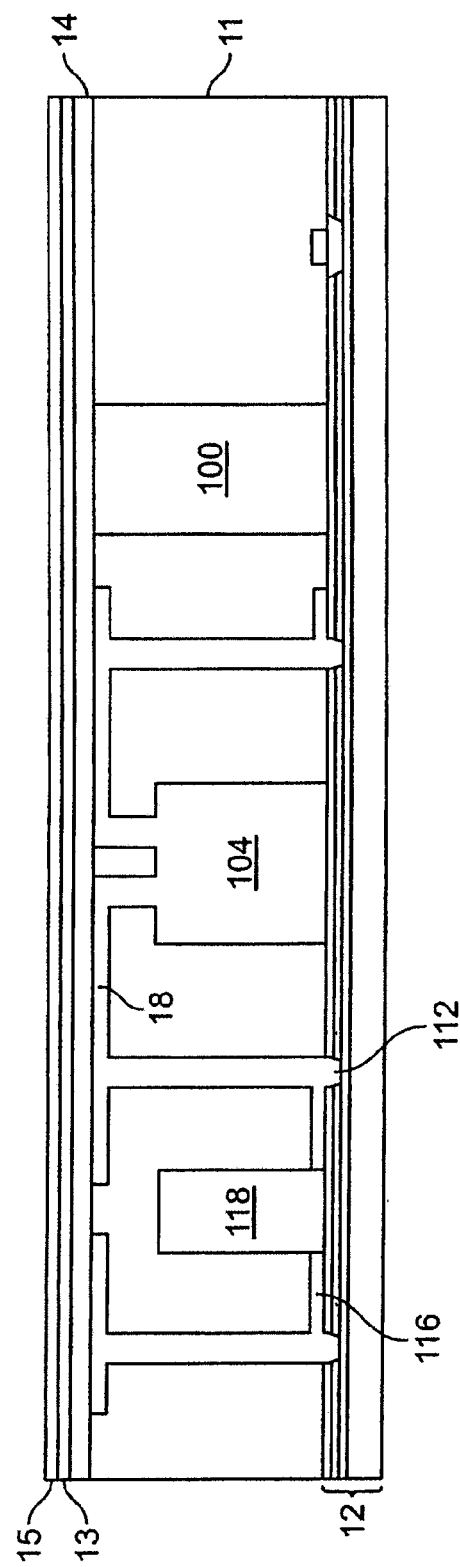
FIGS. 13-18 are cross-sectional schematic representations of stages of forming an apparatus for fluid droplet ejection.
Figure 14:
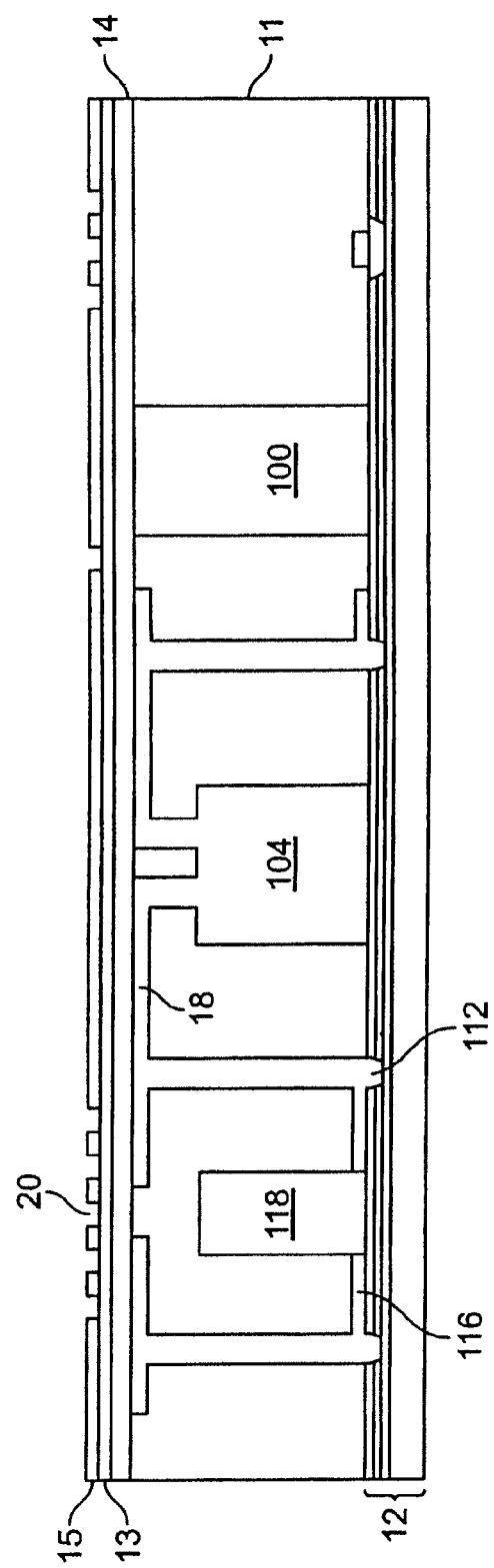
Figure 15:
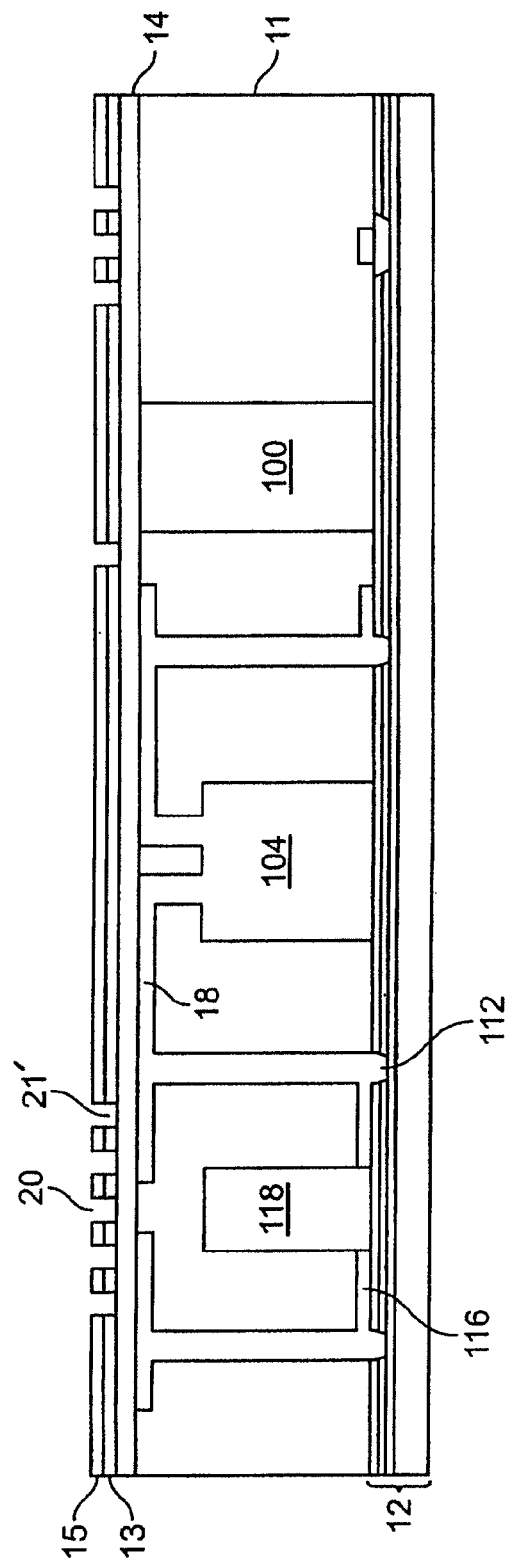
Figure 16:
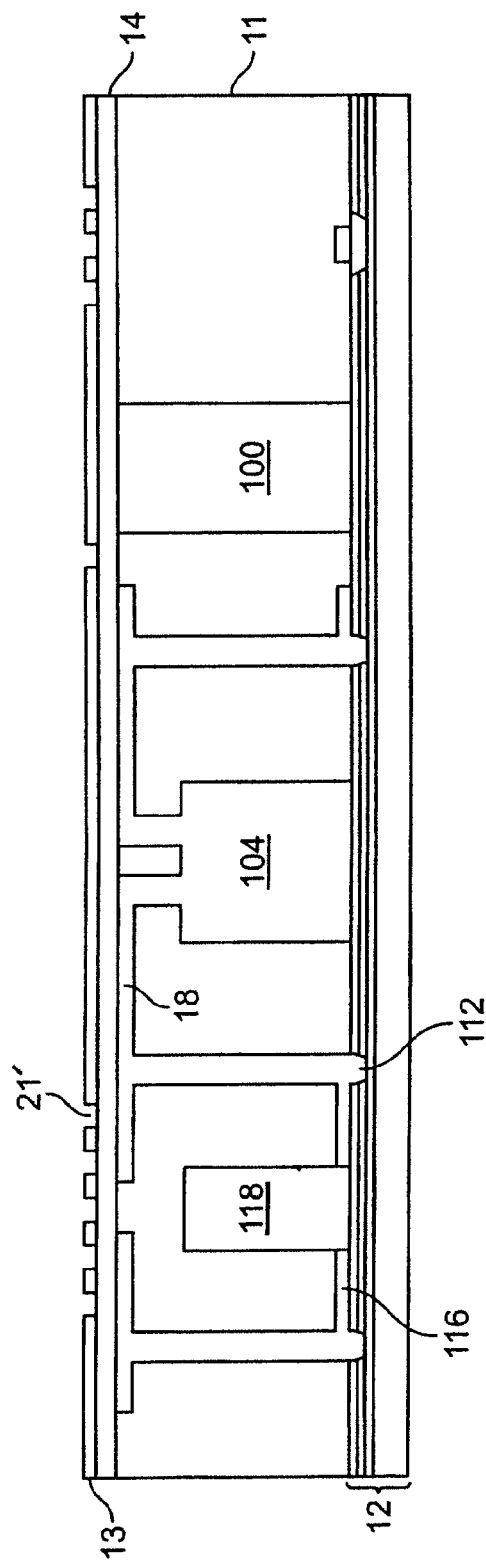
Figure 17:
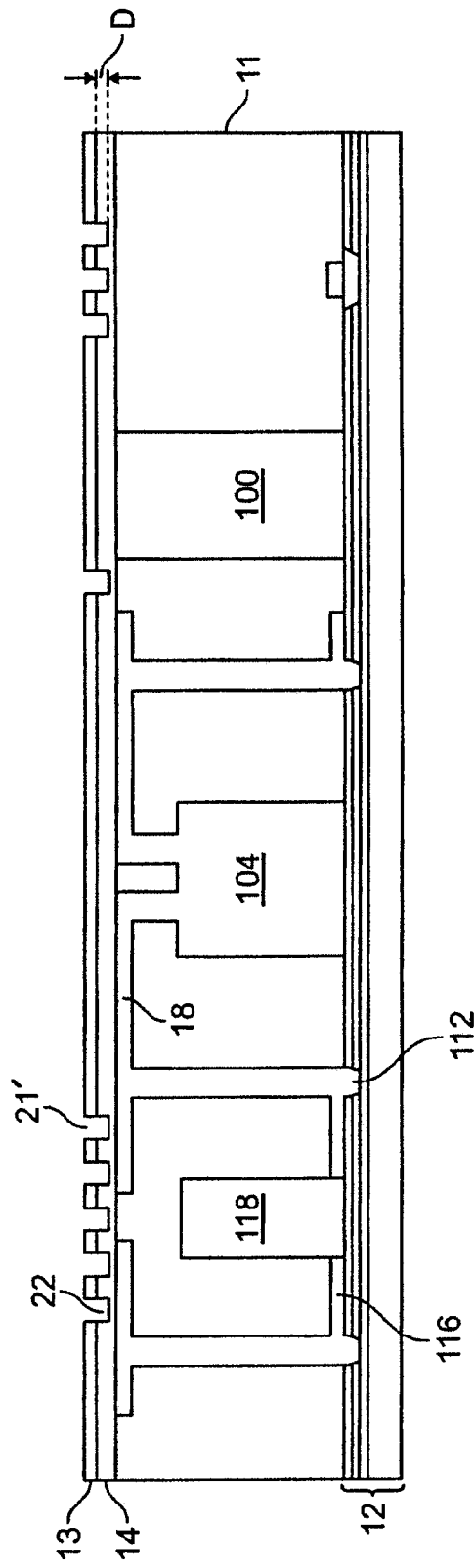
Figure 18:
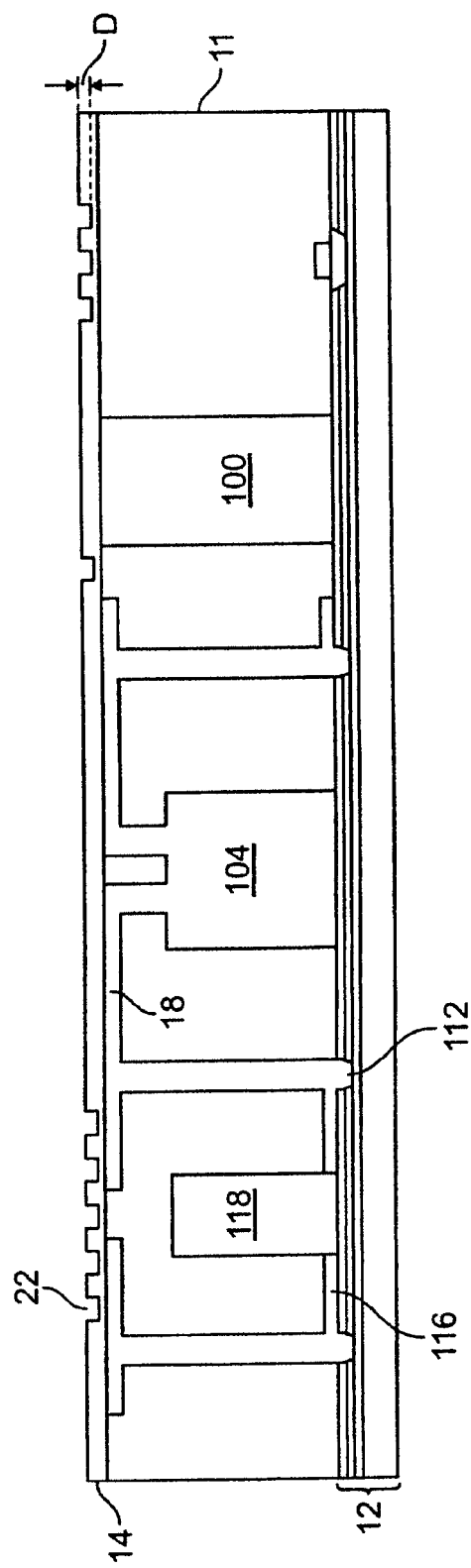

FIG. 12 is a flow chart showing an alternative method of forming the grooves 22 in the membrane 14. FIGS. 13-18 are cross-sectional diagrams of steps in the fabrication of an apparatus for fluid droplet ejection. As shown in FIG. 13, a texture mask 13 is formed on top of the membrane 14 (step 905). The texture mask 13 can be made from an oxide, such as silicon oxide. Use of a texture mask 13 can be desirable where, for example, the texture mask 13 has a higher selectivity than photoresist. That is, a smaller thickness of texture mask 13 can be used to etch the membrane 14 to a relatively larger depth. A photoresist layer 15 is formed on top of the texture mask 13 (step 915). Referring to FIG. 14, the photoresist layer 15 is patterned using conventional photolithography techniques so that portions of the photoresist layer 15 are removed, and apertures 20 are thereby formed in the photoresist layer 15 (step 925). Referring to FIG. 15, the texture mask 13 is etched through the apertures 20 in the photoresist layer 15 to form apertures 21' in the texture mask 13 (step 935). Referring to FIG. 16, the photoresist layer 15 is then removed (step 945). Referring to FIG. 17, the membrane 14 is then etched through the apertures 21' in the texture mask 13 to form grooves 22 (step 955). In the implementation shown, the grooves 22 do not extend entirely through the membrane 14, as described above. Referring to FIG. 18, the texture mask 13 is then removed, such as by grinding, by bathing in hydrofluoric acid, or some other suitable mechanical or chemical mechanism (step 965). Adhesive 26 is applied to, or formed on, a surface of the transducer 30 facing the membrane 14 (step 975), and the transducer 30 with adhesive 26 is placed on the membrane 14 (step 985), as shown in FIG. 8. Alternatively, adhesive 26 is applied to the membrane 14 instead of, or in addition to, adhesive 26 being applied to the transducer 30. Pressure can be applied, and adhesive 26 is allowed to at least partially flow into the grooves 22 (step 995).

The above-described implementations can provide none, some, or all of the following advantages. Flow of the adhesive into recesses or grooves can minimize the thickness of the adhesive between the transducer and the membrane. Reducing the thickness of adhesive can reduce the energy required to actuate a transducer and change the volume of a fluid pumping chamber so as to cause fluid droplet ejection. Further, where the thickness of applied adhesive is non-uniform, providing space for adhesive to flow mitigates or prevents a build-up of adhesive, which might otherwise press the membrane into the pumping chamber and could thereby alter the effectiveness of the transducer when actuated. Particularly where multiple pumping chambers and nozzles are used, varying degrees of deflection of the membrane into the pumping chambers can result in varying degrees of effectiveness among the multiple pumping chambers. Variations in the effectiveness across multiple pumping chambers can cause variation of fluid droplet ejection size or speed among the multiple nozzles, which may cause incorrect fluid droplet size or placement on a medium. By mitigating or preventing deflection of the membrane by adhesive, the grooves described above can improve uniformity of fluid droplet ejection characteristics, such as fluid droplet size and speed. Uniformity among actuators on a die is thereby improved, which decreases the likelihood of incorrect fluid droplet placement.

The use of terminology such as "front," "back," "top," and "bottom" throughout the specification and claims is for illustrative purposes only, to distinguish between various components of the fluid droplet ejection apparatus and other elements described herein. The use of "front," "back," "top," and "bottom" does not imply a particular orientation of the fluid droplet ejection apparatus, the substrate, the die, or any other component described herein.

A number of embodiments of the invention have been described. Nevertheless, it will be understood that various modifications may be made without departing from the spirit and scope of the invention. For example, grooves in the membrane could be any shape or profile that provides space for adhesive to flow or reside. Accordingly, other embodiments are within the scope of the following claims.

What is claimed is:

1. An apparatus comprising:
   a plurality of flow paths, each flow path comprising
   a pumping chamber;
   a membrane having a membrane surface, the membrane adjacent to the pumping chamber;
   a transducer having a transducer surface arranged substantially parallel with the membrane surface;
   a groove formed in the membrane surface over the pumping chamber near a center of the transducer; and
   an adhesive connecting the membrane surface to the transducer surface, the adhesive substantially filling the groove such that there are no voids in the groove, wherein the ratio between a depth of the groove and a width of the groove is less than about 0.1.

2. The apparatus of claim 1, wherein the transducer comprises a piezoelectric material.

3. The apparatus of claim 2, wherein the piezoelectric material comprises lead zirconium titanate.

4. The apparatus of claim 1, wherein the groove has a width of between about 20 microns and about 60 microns.

5. The apparatus of claim 1, further comprising a plurality of grooves formed in the membrane surface over each pumping chamber.

6. The apparatus of claim 5, wherein a pitch of the grooves is between about 50 microns and about 70 microns.

7. The apparatus of claim 5, wherein a spacing between grooves is between about 15 microns and about 25 microns.

8. The apparatus of claim 5, wherein depths of the grooves are substantially equal to one another.

9. The apparatus of claim 1, wherein a depth of the groove is between about 0.1 microns and about 2.0 microns.

10. The apparatus of claim 1, wherein the adhesive comprises benzocyclobutene.

11. The apparatus of claim 1, wherein the adhesive includes a layer located between the membrane surface and the transducer surface in regions of the membrane surface outside the grooves.

12. The apparatus of claim 11, wherein the layer has a thickness of 200 nm or less.

13. The apparatus of claim 1, wherein the membrane has a thickness between about 8 and about 20 microns.

14. The apparatus of claim 1, wherein each transducer is individually controllable to eject fluid from the flow path.

15. The apparatus of claim 1, wherein the groove includes a first portion that is entirely covered by the transducer and a second portion that is not covered by the transducer.

16. The apparatus of claim 1, wherein the groove has a width of between about 20 microns and about 60 microns.

17. A method comprising:
arranging a transducer surface of a transducer substantially parallel with a membrane surface of a membrane, the transducer surface facing the membrane surface and the membrane surface including a groove over a pumping chamber near a center of the transducer;
applying an adhesive to the transducer surface or the membrane surface or both;
pressing the transducer surface against the membrane surface; and
allowing the adhesive to flow in the groove and substantially fill the groove such that there are no voids in the groove,
wherein the ratio between a depth of the groove and a width of the groove is less than about 0.1.

18. The method of claim 17, wherein the transducer comprises a piezoelectric material.

19. The method of claim 18, wherein the piezoelectric material comprises lead zirconium titanate.

20. The method of claim 17, wherein the adhesive comprises benzocyclobutene.

21. The method of claim 17, further comprising forming a plurality of flow paths, each flow path having a pumping chamber and a transducer, wherein each transducer is individually controllable to eject fluid from the flow path.

22. The method of claim 17, wherein the transducer surface includes a plurality of grooves for each pumping chamber.

23. The method of claim 22, wherein a spacing between the plurality of grooves is sufficiently narrow that at least some of the adhesive travels to one of the grooves before the adhesive cures.

24. The method of claim 17, wherein pressing the transducer surface against the membrane surface leaves the adhesive in a layer located between the membrane surface and the transducer surface in regions of the membrane surface outside the grooves.

25. The method of claim 24, wherein pressing the transducer surface against the membrane surface results in the layer having a thickness of 200 nm or less.

26. The method of claim 17, further comprising positioning the transducer such that the groove includes a first portion that is entirely covered by the transducer and a second portion that is not covered by the transducer.

27. The method of claim 17, wherein the groove has a width of between about 20 microns and about 60 microns.

28. The method of claim 17, wherein the adhesive flows into the groove before traveling to an edge of the transducer.

* * * * *